United States Patent [19]

Mueller

[11] Patent Number: 4,653,016

[45] Date of Patent: Mar. 24, 1987

[54] DIGITAL FILTERS FOR REMOTE CONTROL RECEIVERS

[75] Inventor: Beat Mueller, Zollikon, Switzerland

[73] Assignee: Zellweger Uster, Ltd., Uster, Switzerland

[21] Appl. No.: 535,255

[22] Filed: Sep. 23, 1983

[30] Foreign Application Priority Data

Oct. 1, 1982 [CH] Switzerland ..................... 5804/82

[51] Int. Cl.$^4$ ............................................. G06F 7/38
[52] U.S. Cl. .................................................. 364/724
[58] Field of Search ........................................ 364/724

[56] References Cited

U.S. PATENT DOCUMENTS

| | | | |
|---|---|---|---|
| 4,007,360 | 2/1977 | Kniel et al. | 364/724 |
| 4,060,735 | 11/1977 | Poscucci et al. | 340/310 A |
| 4,126,793 | 11/1978 | de Vries | 340/310 A |
| 4,317,092 | 2/1982 | Potter | 364/72 X |
| 4,467,440 | 8/1984 | Sano et al. | 364/724 |
| 4,489,391 | 12/1984 | Morikawa | 364/724 |
| 4,524,422 | 6/1985 | Kasuga | 364/724 |

FOREIGN PATENT DOCUMENTS 2708074  8/1978  Fed. Rep. of Germany ...... 364/724

OTHER PUBLICATIONS

*Halbleiter–Schalttechnik,* (Tietze/Schenk), pp. 594–615, 5th Ed., Springer–Verlang, Berlin, 1980.
"Theory and Design of Digital Filters", *Electronic Engineering* (Lawson), pp. 43–46, May 1977.
*Theory and Application of Digital Signal Processing* (Rabiner/Gold), pp. 40–51, Prentice Hall International Inc., London 1975.

*Primary Examiner*—James D. Thomas
*Assistant Examiner*—Dale M. Shaw
*Attorney, Agent, or Firm*—Antonelli, Terry & Wands

[57] ABSTRACT

In providing digital filters for remote control receivers, in particular, for audio-frequency centralized ripple control receivers in an economic manner, it is advantageous to be able to use a processor unit with as low a bit number as possible (for example, an 8-bit microcomputer). In a conventional design of a filter according to the prior art, the dynamic range which is provided with an 8-bit processor element is insufficient in ensuring a perfect operation of the filter when a quality factor Q of about 30 is needed for the intended purpose of use and, on the other hand, when the dynamic range of the wanted signal which is given in practice is taken into consideration. A solution is indicated which overcomes these difficulties, which particularly involves the selected arrangement of zeros in the pass-band of the filter.

5 Claims, 7 Drawing Figures

Fig. 1

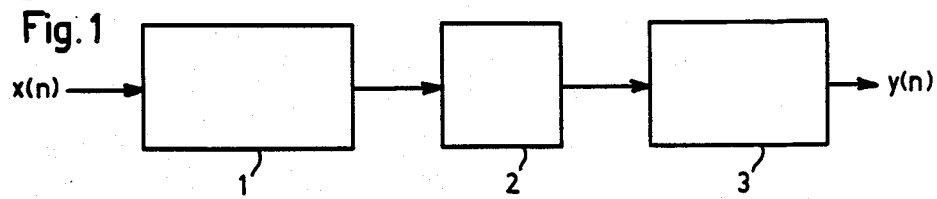

Fig. 2

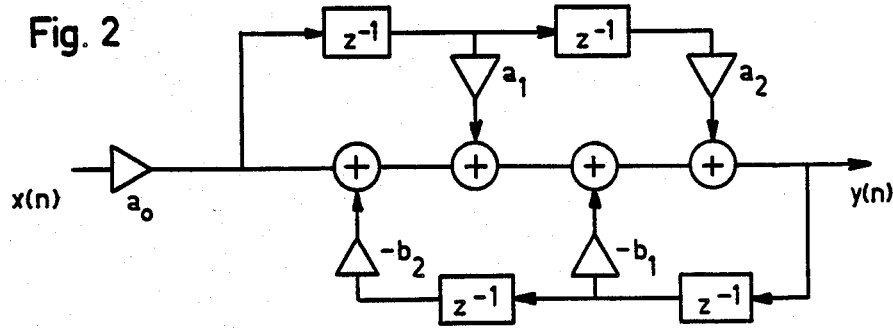

x(n)   : Sequence of input data   (digitized input signal)

$a_0$   : Prescaler $a_1, a_2$ : Filtercoefficients, determining the zeros of the tranfer function $b_1, b_2$ : Filtercoefficients, determining in the poles of the transfer function $\boxed{z^{-1}}$ : Register delaying $x(n)+a_0$ (resp. $y(n)$) by one clock period $\oplus$ : Adder $\triangleright$ : Multiplicator by a factor $a_i$ or $b_i$ Appropriate transfer function (frequency domain)

$$H(z) = \frac{Y(z)}{X(z)} = a_0 \frac{1 + a_1 \cdot z^{-1} + a_2 \cdot z^{-2}}{1 + b_1 \cdot z^{-1} + b_2 \cdot z^{-2}}$$

DIGITAL FILTERS FOR REMOTE CONTROL RECEIVERS

BACKGROUND OF THE INVENTION

The present invention relates in general to digital filters, and more directly, to digital filters for use in remote control receivers, in particular, for audio-frequency centralized ripple control receivers.

Remote control receivers which receive an input signal in the form of a signal superimposed upon the line voltage, especially ripple control receivers, are used in some industries in large numbers. For reasons of economy, it is essential that such receivers be dependable and inexpensive, notwithstanding the technical requirements placed thereon. For practical reasons, it is additionally desirable to maintain the size of such receivers as small as possible, and this has been accomplished in recent years with the use of microprocessors.

Such receivers typically include a selective receiver section for the assigned remote control frequency, an evaluation section responsive to the output of the receiver section for detecting the remote control commands which are in coded form, and an output section for effecting control on the basis of the detected commands.

In conventional electronic or electromechanical remote control receivers of the type used, for example, in centralized ripple control systems, cascades of LC filters, or RC active filters of the second order, have been typically employed for the receiver-side recovery of the remote control signals or remote control commands which are delivered at the input side to the remote control receiver together with the main voltage, the harmonics thereof and possibly other interference frequencies.

In these cases, filters of this type are designed as narrow band-pass filters. The quality factor Q is usually about 30, so that a relatively-weak remote control signal of, for example, from about 1 to 8 volts may be filtered out for evaluation from the low-voltage mains of, for example, 220 V (50 Hz), which, to some extent, carries very considerable interferring signals. In this respect, see, for example, the de Vries U.S. Pat. No. 4,126,793, which is assigned to the same assignee as the present application.

The mains voltage of 220 V and the harmonics thereof having voltages of normally up to 15 volts, and occasionally even slightly higher, occur as interference frequencies. In this respect, see the publication VDEW: Empfehlung fur die Frequenzplanung bei Frequenz-Rundsteueranlagen, Verlags-und Wirtschaftsgesellschaft der Elektrizitatswerke mbH, 6 Frankfurt (Main) 1970.

A method of and an apparatus for the remote transmission of signals has already been proposed in the Kniel et al U.S. Pat. No. 4,007,360, also assigned to the same assignee as the present application, in which method a sampled data filter is provided in the form of a digital band-pass filter. Furthermore, an electronic ripple control receiver has been proposed in DOS No. 2,708,074, without, however, more detailed information being given about the digital filter provided therein.

In addition to the publications which have already been mentioned, reference is also made to the following prior art works: *Halbleiter-Schalttechnik* (Tietze/-Schenk), 5th Edition, Springer-Verlag Berlin 1980; the dissertation No. 5,645/1976 ETH Zurich; Probleme der Realisierung digitaler Filter, (F. Bonzanigo) and the publication "Theory and Design of Digital Filters", *Electronic Engineering*, May, 1977, Morgan Grampian Limited, Galderwood Street, London SE 18 2 BP.

When a digital filter is used with a microcomputer as a processor unit for the evaluation section of a ripple control receiver, it has been difficult to provide a filter having the properties required by such intended use in an economical manner. A particular difficulty arises in that, with use of the economically-desirable 8-bit processor unit (microcomputer), a suitable digital filter of known type cannot be realized without taking special measures.

Bearing in mind the dynamic range required by such use, a known analog filter for remote control receivers cannot be readily transformed into a digital filter according to generally-known rules. Due to the internal gain of the filter in response to the input signal, i.e., the remote control signal itself, an 8-bit processor unit already tends to overflow, even when no interference signal has appeared in the input signal. With respect to the useful signal/interference signal ratios alone which occur in practice, an 8-bit processor unit would indeed have a dynamic range which would just suffice for the signal processing of the control signal alone. Thus, it has been found in practice that the signal gain which has been mentioned jeopardizes the perfect operation of the filter. The overflow within the filter stages caused thereby is also a result of the quality factor Q of about 30 which is needed for practical requirements, and is a result of the sampling ratio of at least two, which is required in practice, i.e., the ratio between the sampling frequency of the input signal and of the resonant frequency.

It is very important for the use of a digital filter in a remote control receiver, in particular, in an audio-frequency centralized ripple control receiver, that the pass-band characteristic which is necessary for perfect operation be realized with utmost economy. It will probably always be financially advantageous to be able to use a processor unit having as short a dynamic range as possible (for example, only 8 bits), such as provided by a microcomputer having an 8-bit processor unit.

By the stabilization of the clock frequency, whether, for example, by means of a known crystal oscillator or by phase locking the clock frequency to a reference frequency, for example, to the mains frequency, an adequate frequency stability may be achieved with a very low expenditure, even over a long duration of use. Therefore, the filter characteristic of a digital filter of this type may be designed within a restricted, but in practice, adequate frequency range in basically the same manner as for hitherto conventional analog filters, i.e., the same amplitude response and the same phase response is achieved as with the conventional filters. However, for the production of a filter of this type by means of a processor unit (microcomputer), for example, according to DOS No. 2,708,074, the fact that the digital filtering must be realized in the processor unit with an adequately-low expenditure in calculating time, must be taken into consideration because the system must be operated in real time.

Another objective to be aimed for is that a processor unit from the class of the most financially-desirable "one-chip" microcomputers be selected. A price-determining factor is the so-called bit number of the microcomputer. In the present case, this term is understood as meaning the length of the data words which are used, i.e., the number of binary positions per number. The values which are compiled in Table 1 are conventional at present.

TABLE 1

| | |
|---|---|
| 4 Bit Number range 0–15 ($2^4$) | Dynamic range 24 db |
| 8 Bit Number range 0–255 ($2^8$) | Dynamic range 48 db |
| 12 Bit Number range 0–4 095 ($2^{12}$) | Dynamic range 72 db |
| 16 Bit Number range 0–65 535 ($2^{16}$) | Dynamic range 96 db |

The bit number defines the processor dynamic range of the microcomputer or processor unit.

With respect to the processor speed, care must also be taken that a financially-favorable standard product be used. This means that for the digital filter, minimal structures should be used which require as low a processor expenditure as possible for the filtering, i.e., few additions, few multiplications and few memory manipulations. Such minimal requirements are provided by recursive filters in a "direct form", like those described in the publication "Theory and Application of Digital Signal Processing" (Prentice Hall International, Inc., London, 1975) by Rabbiner/Gold, on Page 41 et seq.

A man skilled in the art will transform the characteristic coefficients of an analog filter by one of the known transformation techniques, as described in the above-mentioned publication and also in the publication by Tietze/Schenk, which has already been mentioned, for example, a bilinear transformation, such that he obtains the coefficients of the digital filter with similar properties. The digital filter then conforms substantially to the analog filter with respect to its pass-band characteristic up to half the sampling frequency. He then realizes these coefficients in a suitable filter structure according to the above-mentioned references.

Although this method will achieve the purpose as regards the required pass-band characteristic, it has the disadvantage that the resulting digital filter requires a substantially greater dynamic range of the processor unit to be used than would be necessary from the given useful signal/interference signal ratio. It has been found that, as a result of the relatively-high quality factors Q which are necessary for filters in centralized ripple control uses, the individual filter stages have a correspondingly-high amplification of the resonant frequency fg (i.e., in this case of the useful signal). The correlation represented in Table 2 applies in the case of a filter stage of the second order having a quality factor Q of 30.

TABLE 2

| Sampling frequency $f_s$ | approximate amplification at fg |
|---|---|
| $10 \times f_g$ | 100 |
| $6 \times f_g$ | 55 |
| $4 \times f_g$ | 40 |

The amplification $v_g$ at frequency $f_g$ is calculated according to the following formula:

$$v_g \triangleq |X(e^{j\omega g})| = \frac{Z_1 \cdot Z_2}{P_1 \cdot P_2} \quad (I)$$

for a filter stage of the second order wherein $$Z_i \triangleq |e^{j\omega g} - z_i| \quad Z_i = Z_1, Z_2 \quad (I)$$

and $$P_i = |e^{j\omega g} - P_i| \quad P_i = P_1, P_2 \quad (II)$$

$z_i$ are the zeros of the Z-transfer function of the filter
$P_i$ are the poles of the Z-transfer function of the filter. In this respect, also see the above-mentioned publication Rabbiner/Gold, Chapter 218.

As a tendency, it is to be established that the resonant frequency amplification $v_g$ of the filter stage also increases with an increase in the filter quality factor Q and with an increase in the sampling rate (ratio of the sampling frequency $f_s$ to the resonant frequency $f_g$).

With a sampling rate of from about 6 to 10, and with a filter quality factor of 30, a gain of the wanted signal by factor 55 to 100 is to be reckoned with. This means that a minimal wanted signal which is reasonably given to the first filter stage with at least ±2 processor units (one processor unit corresponds to the number "1"), appears at the output with from ±110 to ±200 processor units. In the case of higher useful signal levels which could quite easily occur in practice, the need for a processor dynamic range of the processor unit increases accordingly, as shown by the following Table 3.

TABLE 3

| | Arithmetic units at the filter | | Necessary dynamic |
|---|---|---|---|
| Useful Signal | Input | Output | range |
| 1 V | ±2 | ±110 to ±200 | 8 to 9 bit |
| 2 V | ±4 | ±220 to ±440 | 9 to 10 bit |
| . | | | |
| . | | | |
| 8 V | ±16 | ±800 to ±1760 | 11 to 12 bit |

If it is assumed that, in existing low-voltage mains, the signal/interference voltage ratio for any interference voltage which arises over a comparatively-long period of time, for example, a mains harmonic, hardly falls below the value 1/20, then it is seen that even under circumstances in which several interference voltages occur at the same time, a processor resolution of 1/256, as given by an 8-bit processor unit, should actually suffice, if it succeeds in eliminating the internal amplification of the filter stages. However, it is assumed that the voltage of the base frequency has itself already been reduced to a sufficient extent by a suitable analog pre-filter. This is possible using simple known means and a pre-filter is necessary anyway, as is known, because of the ambiguity of digital filters.

It is therefore apparent from the foregoing discussion that the task of digital filtering of centralized ripple control signals by means of financially-desirable processor units (8-bit microcomputers) and by an integrated 8-bit-analog-digital converter in a "one-chip" design and by means of minimal filter structures, cannot be achieved by simply transforming an existing analog, narrow band-pass filter into a digital, narrow band-pass filter according to generally-known rules. As a result of an internal amplification of the useful signal, the 8-bit processor unit tends to overflow, that is, even when there are still no interference frequencies. From the view point of the wanted signal/interference signal ratios alone, an 8-bit processor unit would, however, have an adequate dynamic range.

SUMMARY OF THE INVENTION

Therefore, an object of the present invention is to provide a method controlling a digital filter which is suitable for remote control receivers, in particular for audio-frequency centralized ripple control receivers in which, in spite of using a processor unit (microcomputer) which has a dynamic range of only 8 bits, the overflows which have been mentioned in connection with the prior art, no longer occur and realization of 5 digital filter having a pass-band characteristic which is suitable for the intended use is possible.

This invention is based on the following concept. Dictated by the requirement of a high quality factor for the narrow band-pass filter and by the requirement of a low processor expenditure, a suitable filter structure is selected, for example, a so-called recursive filter of the fourth order, produced as a cascade of two recursive filters of the second order. In such an arrangement, the problems of the high resonant frequency amplification of the individual stages are countered by the intentional positioning of zeros at selected points in the vicinity of the resonant frequency.

BRIEF DESCRIPTION OF THE DRAWINGS

Embodiments of the present invention will now be described by way of example, with reference to the accompanying drawings, in which:

FIG. 1 is a schematic diagram which shows a conventional digital filter structure of the type to which the present invention is applicable;

FIG. 2 schematically shows a digital filter stsage of the second order;

DETAILED DESCRIPTION OF THE PREFERRED EMBODIMENT

FIG. 1 shows a filter structure according to the publication "Theory and Application of Digital Signal Processing", by Rabbiner/Gold at page 41 et seq. In FIG. 1 $x(n)$ represents a sequence of input data (a sampled and digitized input signal) applied to a first digital filter stage 1 of the second order (recursive digital filter). The output of stage 1 is applied to a digital divider 2 (division unit) whose output is applied to a second digital filter stage 3 of the second order, from which is produced a sequence $y(n)$ of output data.

FIG. 2 shows a typical structure of a digital filter stage of the second order, which may be used for the stages 1 and 3 of the filter structure of FIG. 1. The digital filter stage of FIG. 2 is made up of the following signals and component elements:

$x(n)$: sequence of input data (digitized input signal)
$a_0$: prescaler
$a_1, a_2$: filter coefficients, determining the zeros of the transfer function
$b_1, b_2$: filter coefficients, determining the poles of the transfer function
$\boxed{z^{-1}}$ : register delaying $x(n)+a_0$ (resp. $y(n)$) by one check period
$\oplus$ : adder
$\triangleright$ : multiplier by a factor $a_i$ or $b_i$ The transfer function (frequency domain) for the filter stage of FIG. 2 is as follows:

$$H(z) = \frac{Y(z)}{X(z)} = a_0 \frac{1 + a_1 \cdot z^{-1} + a_2 \cdot z^{-2}}{1 + b_1 \cdot z^{-1} + b_2 z^{-2}}$$

Figure 3:
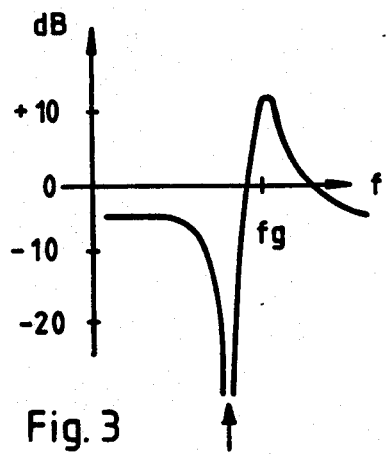
FIG. 3 is a characteristic diagram of a pass-band characteristic of a first filter stage.
Figure 4:
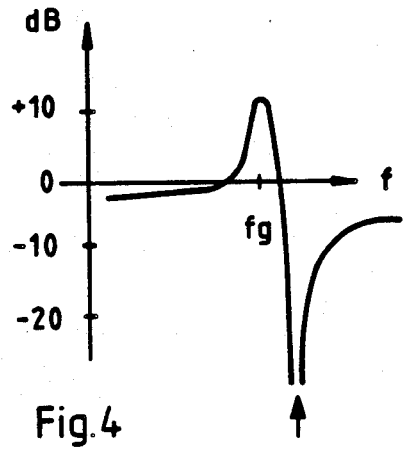
FIG. 4 is a characteristic diagram of a pass-band characteristic of a second filter stage.
Figure 5:
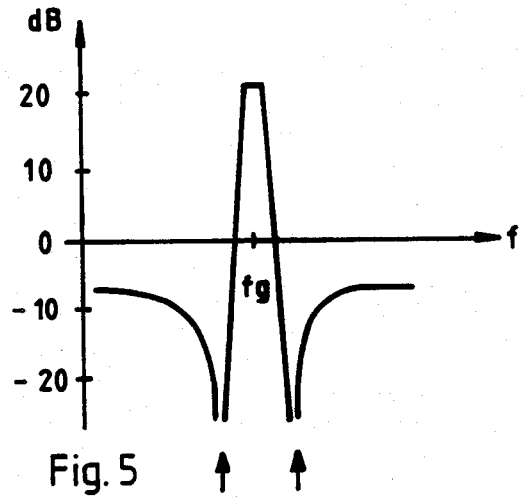
FIG. 5 is a characteristic diagram of a complete pass-band characteristic over the two stages according to FIGS. 3 and 4 in a cascade arrangement.

The first stage 1 of the filter structure of FIG. 1 is provided with a pass-band characteristic generally according to FIG. 3 by suitable adjustment of the filter coefficiencts, and the second stage 3 is provided with a pass-band characteristic generally according to FIG. 4. A complete pass-band characteristic generally according to FIG. 5 is then produced over both stages connected in a cascade. The arrows in FIGS. 3, 4 and 5 mark the position of the zeros.

A pair of zeros comes to lie on the frequencies $f=0$ and $f=f_s/2$ in the bilinear transformation, as previously mentioned, and thereby causes a blocking of the filter at frequencies towards 0 and towards $f_s/2$ or integral multiples of $f_s/2$. ($n=1, 2, 3 \ldots$) In this respect, see the above-mentioned reference "Theory and Application of Digital Signal Processing" (Rabbiner/Gold), p. 221. If these zeros are positioned in the vicinity of the resonant frequency $f_g$, the filter receives a finite pass-band at $f=0$ and at $f=n.f_s/2$. This disadvantage must be taken into account. It is overcome by the simple known pre-filter which has already been mentioned. Experiments have shown that with a favorable choice of the zeros, this disadvantage is substantially less significant than the advantage provided in that the factors $Z_1$ and $Z_2$ in the previously mentioned formula (I) are reduced to such an extent that acceptable values emerge for the resonant frequency amplification $v_g$ per filter stage of the second order. If the zeros next to the frequency $f_g$ are positioned at $f=f_g \pm 10\%$, a pass-band characteristic of a digital filter of this type according to FIG. 5 is produced.

Figure 6:
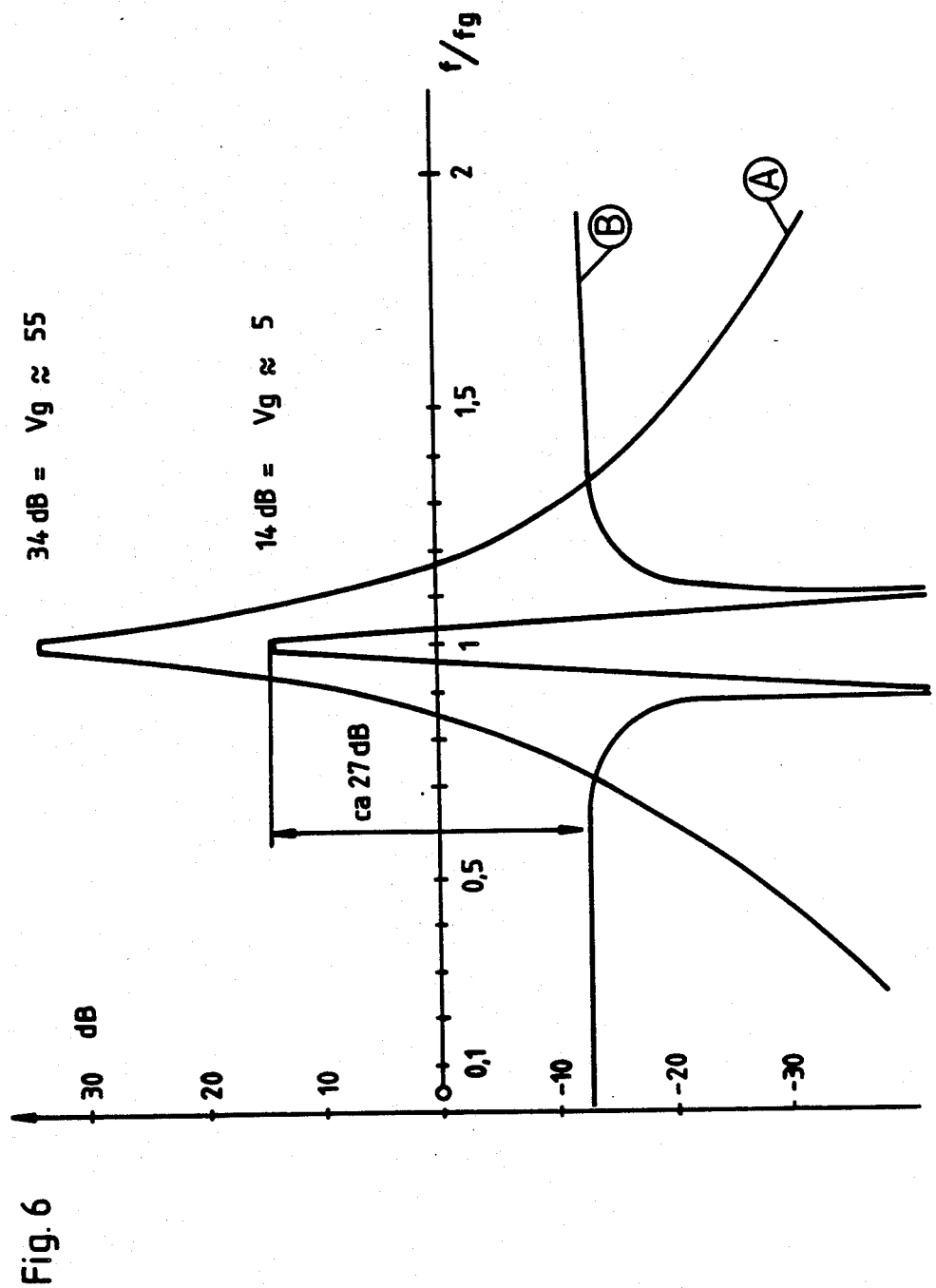
FIG. 6 is a diagram of a complete pass-band curve with zeros at + and −10% below and respectively above the required incoming frequency.

The curve A in FIG. 6 shows the amplitude response of a filter according to FIG. 1, the two filter stages each having one zero at $f/f_g=0$ and $f/f_g=f_x/(2 \cdot f_g)$, as produced from the bilinear transformation. Both stages have a resonant frequency amplification of 35 dB (factor 55). The divider has a division ration of 1:55 (−34 dB). The maximum signal gain of the first stage is thereby scaled back to value 1.

The curve B in FIG. 6 shows the amplitude response of a filter (according to FIG. 1), the first filter stage having a zero 10% below the resonant frequency and the second filter stage having a zero 10% above the resonant frequency. The amplitude response of the first stage is represented in FIG. 3, and that of the second stage is represented in FIG. 4. The resonant frequency amplification still only has about 14 dB (factor 5) per filter stage, in contrast to 34 dB (factor 55) for the above-mentioned filter, by means of these shifted zeros. This had a favorable effect for the necessary dynamic range of the processor unit. In this case, the divider between the filter stages has a division ratio of 1:5. The filter has in the near-selective region equally good properties, or it obtains even slightly-better properties. However, in the far-off region, it obtains a finite attenuation of about −27 dB, based on the resonant frequency.

The following considerations are recommended for the choice of the position of the zeros in the frequency response:

1. Acceptable resonant frequency amplification, depending on the sound volume range of the processor unit provided for use.

2. Acceptable course of the pass-band characteristic in the far-off region with respect to the requirements imposed on the pre-filter which has already been mentioned.

It should be noted here that the resonant frequency amplification $v_g$ decreases the nearer the zeros are positioned to the resonant frequency. However, the attenuation decreases in the far-off region, and the requirements imposed on the pre-filter consequently increase. Reference is made to the correlations represented in the following Table 4 to facilitate the selection of optimum parameters.

TABLE 4

| 2 filters stages each of the second order Q about 30, sampling rate about 6 | | |
|---|---|---|
| Zeros | $v_g$ per stage (absolute) | Attenuation at f = 0 |
| $f_g \pm 5\%$ | about 2.5 (+8 db) | −15 db |
| $f_g \pm 10\%$ | 5 (+14 db) | −27 db |
| $f_g \pm 20\%$ | 12 (+21 db) | −39 db |
| $f_g \pm 40\%$ | 25 (+28 db) | −53 db |

If a processor unit having an 8-bit dynamic range is used, i.e., corresponding to 48 db, and if the calculations are made using useful signals of ±1 to ±16 units input sound volume range, corresponding to 30 db, it is seen that the zeros must lie within a range $f_g \pm 20\% \cdot v_g +$ dynamic range of the input signal: 21 db + 30 db = 51 db. On the other hand, a relative attenuation (based on the pass-band) of about −30 db should be achieved in the attenuation band of the filter. Consequently, there is produced according to the example in Table 4, a minimum spacing of the zeros of $f_g \pm 10\%$ for an attenuation of −27 db in the far-off region (for example, f=0). The missing −3 db may be produced by the analog pre-filter which is in any case necessary.

Consequently, there are produced in practice optimum positions of the zeros between $f = f_g \pm 20\%$ and $f = f_g \pm 10\%$. This applies in the case of a sampling rate of 6 and a quality factor Q of about 30.

A digital filter according to the present invention which is suitable, for example, for a centralized ripple control receiver has, for example, the following characteristic values stated in Table 5.

TABLE 5

| Ripple control frequency | 167 Hz ( 10 · 16⅔ Hz) |
|---|---|
| 1. Interference frequency | 150 Hz ( 3 · Mains harmonic) |
| 2. Interference frequency | 184 Hz (= remote control frequency of an adjacent installation). |

In this example, the ratio of the interference frequencies to the wanted frequency is 150/167 and 184/167, corresponding to the factors 0.9 and 1.1. These ratios are favorable in that the main interference frequencies are precisely at $f_g \pm 10\%$. Thus, since it is possible to select freely the input zeros in the range of about $f_g \pm 10$ to $f_g \pm 20\%$, it has proven to be particularly favorable to position these zeros exactly on the main interference frequencies, with the result that the filter becomes substantially more insensitive, precisely to these main interference frequencies. Therefore, this measure also produces a marked technical improvement in the filter.

In practice, a digital filter for remote control receivers having zeros in the transfer function may be constructed as follows:

1. A suitable processor unit is selected which has the necessary minimum bit number of, for example, 8 bits. A microcomputer may preferably be used. In order that the pre-filtered analog signal may be directly supplied to the processor unit, it is sensible to use a "one chip" microcomputer having an integrated analog-digital converter. For example, the MC 6805R2 of Motorola Semiconductor Products, Inc., of 3501 Bluestein Blvd., Austin, Tex., 78721, may be selected.

Figure 7:
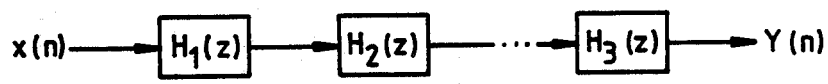
FIG. 7 schematically shows cascaded filter stages of the second order.

2. A suitable filter structure is selected. Filter stages of the second order are preferably cascaded, according to FIG. 7. A suitable structure is also selected for the individual stage, for example, according to FIG. 2.

3. The filter coefficients are then calculated for each filter stage. Suitable methods as to how the coefficients of a given analog filter may be transformed into the corresponding coefficients of the digital filter are known. For example, the bilinear transformation which has already been mentioned. Moreover, methods could also be used to design selective stages of the second order, of a given quality factor Q, directly as a digital filter.

It is essential that for the filter coefficients which determine the position of the zeros, those values are used which produce zeros (maximum attenuation) in the frequency-dependent transmission behavior such that all the requirements imposed on the filter stage which have been stated in the description, are met, such as adequate selectivity and acceptable resonant frequency amplification. These filter coefficients according to FIG. 2 are calculated as follows:

$a_1 = -2 \cdot \cos [2 \cdot \pi \cdot (f_g + \Delta f)/f_s]$ $a_2 = 1$ $\Delta f$ spacing in terms of frequency of the zeros to $f_g$ This provides a basic design of a digital filter which is suitable for remote control receivers. In further steps, it must only be optimized according to the known rules of the art, such as scaling, limiting of the word length of the coefficients, for example. This is effected according to the directions in the references which have been mentioned.

4. The digital filter is then programmed into the processor unit according to the processor unit manufacturer's directions, and embedded in other programs which may also be present and are preferably used for the evaluation of the filter output.

While I have shown and described one embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. A digital filter for remote control receivers which operates in response to control signals at a predetermined input frequency superimposed on a power supply voltage, comprising first and second digital filter stages of the second order connected in cascade, each of said first and second digital filter stages including means for positioning the zeros in the pass-band of the filter stage so as to reduce the resonant frequency amplification of the filter wherein the filter coefficients of each filter stage are such that the zeros in the pass-band of the filter are positioned in terms of frequency, between + and −50% of the resonant frequency ($f_g$) adjacent thereto by placing conjugate complex zeros on the circle of unit radius of the z-plane.

2. A digital filter according to claim 1, wherein the filter coefficients of each filter stage are such that the zeros in the pass-band of the filter lie at least approximately on frequencies which are integral multiples of power supply frequency-subharmonics.

3. A digital filter according to claim 1, wherein said first and second filter stages are formed by two cascaded recursive filters of the second order, the filter coefficients thereof being such as to provide two zeros lying in the range of ±50% of the resonant frequency, based on the predetermined input frequency, the said digital filter being provided with an 8-bit processor unit and having a dynamic range of 1 to 256.

4. A digital filter according to claim 3, wherein the predetermined input frequency and the resonant frequency of the recursive filters, as well as the two zero frequencies, are each integral multiples of the same subharmonic of the power supply frequency.

5. A digital filter according to claim 3, wherein the lower frequency zero frequency and the upper frequency zero frequency of the digital filter stages are successive integral multiples of the same subharmonic of the power supply frequency.

* * * * *